United States Patent
Rudhard et al.

(10) Patent No.: US 7,334,491 B2
(45) Date of Patent: Feb. 26, 2008

(54) SENSOR ARRANGEMENT, IN PARTICULAR A MICRO-MECHANICAL SENSOR ARRANGEMENT

(75) Inventors: Joachim Rudhard, Leinfelden-Echterdingen (DE); Klaus Heyers, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/477,176

(22) PCT Filed: Apr. 19, 2002

(86) PCT No.: PCT/DE02/01452

§ 371 (c)(1),
(2), (4) Date: Jul. 6, 2004

(87) PCT Pub. No.: WO02/093122

PCT Pub. Date: Nov. 21, 2002

(65) Prior Publication Data

US 2004/0232500 A1    Nov. 25, 2004

(30) Foreign Application Priority Data

May 11, 2001    (DE)    ................. 101 23 039

(51) Int. Cl.
*H01L 29/82* (2006.01)

(52) U.S. Cl. ............... 73/866.1; 73/504.01; 73/504.02; 73/504.03; 73/504.04

(58) Field of Classification Search ............... 73/866.1, 73/504.01, 504.02, 504.03, 504.04
See application file for complete search history.

(56) References Cited

U.S. PATENT DOCUMENTS

| | | | | |
|---|---|---|---|---|
| 5,698,783 | A | * | 12/1997 | Murakoshi et al. ...... 73/504.03 |
| 5,952,572 | A | * | 9/1999 | Yamashita et al. ....... 73/504.04 |
| 6,936,902 | B2 | * | 8/2005 | Reichenbach et al. ...... 257/415 |
| 2002/0168800 | A1 | * | 11/2002 | Smith et al. ................. 438/128 |

FOREIGN PATENT DOCUMENTS

| | | |
|---|---|---|
| DE | 195 37 814 | 4/1997 |
| DE | 196 51 269 | 12/1997 |
| DE | 198 20 816 | 11/1999 |

OTHER PUBLICATIONS

Kniffin, M. L. et al.: "Packaging for Silicon Micromachined Accelerometers," *International Journal of Microcircuits and Electronic Packaging*, International Microelectronics & Packaging Society US Bd. 19, Nr. 1, 1996, pp. 75-86.

Partridge, A. et al.: "New Thin Film Epitaxial Polysilicon Encapsulation for Piezoresistive Accelerometers" Technical Digest. Mems. IEEE International Conference on Micro Electro Mechanical Systems, Jan. 21, 2001, pp. 54-59.

* cited by examiner

*Primary Examiner*—Hezron Williams
*Assistant Examiner*—Paul M West
(74) *Attorney, Agent, or Firm*—Kenyon & Kenyon LLP

(57) ABSTRACT

A sensor array, in particular a micromechanical sensor array, and methods for manufacturing the sensor array are provided, which sensor array includes a sensor section for supplying certain sensor signals, and a cover section provided on the sensor section to form a hermetically sealed sensor interior. An electronic analyzer device is at least partially integratable into cover section for analysis of the sensor signals, and electrically connectable to a corresponding circuit device of the sensor section.

9 Claims, 2 Drawing Sheets

SENSOR ARRANGEMENT, IN PARTICULAR A MICRO-MECHANICAL SENSOR ARRANGEMENT

FIELD OF THE INVENTION

The present invention relates to a sensor array, in particular a micromechanical sensor array and methods for manufacturing the micromechanical sensor array.

BACKGROUND INFORMATION

Micromechanical sensors such as rotational rate sensors have been known for a long time. They have one or more micromechanically structured, seismic oscillating masses which are subjected to a controlled periodic movement (excitation movements) in a plane (excitation vibrational plane). These seismic oscillating masses are structured and mounted in such a way that they or parts thereof are also movably suspended in a plane perpendicular to the excitation vibrational plane. This plane is referred to as the detection plane. They also include a detection unit which picks up the displacement of the vibrating mass or masses or parts thereof in the detection plane. Displacement in the detection plane occurs either due to the Coriolis force acting on the moving vibrating masses in the case of linear oscillators, or due to angular momentum conservation in the case of rotational oscillators.

It is also known in the art that a cover section or a cap section may be applied to the corresponding sensor section to create a hermetically sealed sensor interior between the cover section and the sensor section. Such micromechanical sensors require the lowest possible gas pressure in the hermetically sealed sensor interior to achieve a high quality, i.e., low attenuation of the mechanical vibrational structure due to an ambient medium. Such sensors are therefore generally encapsulated in vacuo.

Various approaches are known for connecting sensors and electronic analyzers. In addition to connecting the sensor section and the electronic analyzer via bond wires, integrated embodiments in which the electronics and sensors are manufactured in one manufacturing operation are also known.

Additive integration has also been known for some time. In this method, a sensor structure is applied to a finished electronic chip in a low-temperature process. For example, metals are applied by a galvanic process, or silicon-germanium is applied by a low-pressure deposition process.

Increasing demands on the resolution capability of sensors, and thus on the signal-to-noise ratio of the overall system of sensor section/electronic analyzer, require a reduction in parasitic elements which are caused to a great extent by the feeder lines and bond sites.

One approach to solving this problem involves a monolithic integration of sensor section and electronic analyzer. One disadvantage of this approach is the fact that the sensor process requires a much smaller mask level than does a complex electronic process. Thus, a portion of the chip surface is lost for the electronic function, which is a disadvantage for reasons of cost and space. Furthermore, there is the disadvantage that it is not possible to test the sensor section and electronic analyzer separately, and therefore total yield may be tested only at a relatively high value creation level.

An alternative approach involves additive integration of the sensor section and electronic analyzer. In this case, the sensor section is applied subsequently to a finished analyzer circuit. Parasitic elements may also be reduced significantly by this approach, but only low-temperature processes may be used to manufacture the sensor so as not to damage the electronics. Furthermore, one disadvantage of this approach is that the process window is extremely small, and so far it has not been possible to produce larger components, e.g., rotational rate sensors, because of intrinsic attenuation or voltage gradients.

Furthermore, all approaches mentioned above have the disadvantage that manufacture of the cover or cap section is highly complex, and therefore carries high manufacturing costs.

SUMMARY

The sensor array and the corresponding manufacturing methods according to the present invention have the advantage in comparison with the known approaches that an inexpensive, as well as space-saving, means of connecting sensors and electronic analyzers is achieved by integrating the electronic analyzer at least partially into the cover section. The manufacturing complexity is reduced by integration into the cover section because this eliminates any additional step for mounting the electronic analyzer on the sensor section. The entire array is rendered also more compact and space-saving.

At the same time, the present invention provides short and reproducible paths for the parasitic bonding elements, thus permitting a significant reduction in interference which in the related art could in some cases even be greater than the actual measuring signal.

In accordance with the present invention, an electronic analyzer device is at least partially integratable into the cover section for analysis of the signals of the sensor section and is electrically connectable to a corresponding circuit device of the sensor section.

Therefore, the cover section has multiple functions. First, the sensitive micromechanical structures in the interior of the sensor are protected from dust particles or the like which would distort the measuring signal, and a hermetically sealed area is produced to create a low-pressure area. Second, the cover section functions at least partially as a carrier for the electronic analyzer which is integratable into the cover section.

According to an example embodiment of the present invention, a reduced pressure in comparison with atmospheric pressure is provided in the interior of the sensor. This is advantageous for an optimized functioning of the micromechanical sensor array.

According to another example embodiment of the present invention, the electronic analyzer device which is at least partially integrated into the cover section is provided on the surface of the cover section which is opposite the sensor interior.

According to another example embodiment of the present invention, the part of the electronic analyzer device integrated into the cover section has signal conditioning which permits simple coupling of the sensor array to additional circuit devices, e.g., CMOS circuits. However, integration at some other location is also possible.

According to another example embodiment of the present invention, the electronic analyzer device of the cover section is electrically connectable to the circuit device of the sensor section by at least one through connection, e.g., by a trench structure, which may be a deep trench.

According to another example embodiment of the present invention, the cover section and the sensor section are manufacturable as two separate wafer components. In this case, the cover section is connectable to the sensor section by contact structures, for example, point aluminum structures. For a hermetic seal of the sensor interior, in this case at least one gasket, e.g., an aluminum ring, may be provided between the cover section and the sensor section. In such a design, the cover section may be made of silicon, silicon carbide or silicon-germanium.

According to another example embodiment of the present invention, the cover section is applicable to the sensor section in a step integrated into the manufacturing process of the sensor array, e.g., as a thin-layer section on the sensor section, resulting in a one-piece component at the beginning. In this case the cover section may be made of polysilicon or polysilicon-germanium.

DETAILED DESCRIPTION

In the figures the same reference notation is used for the same components.

Figure 1:
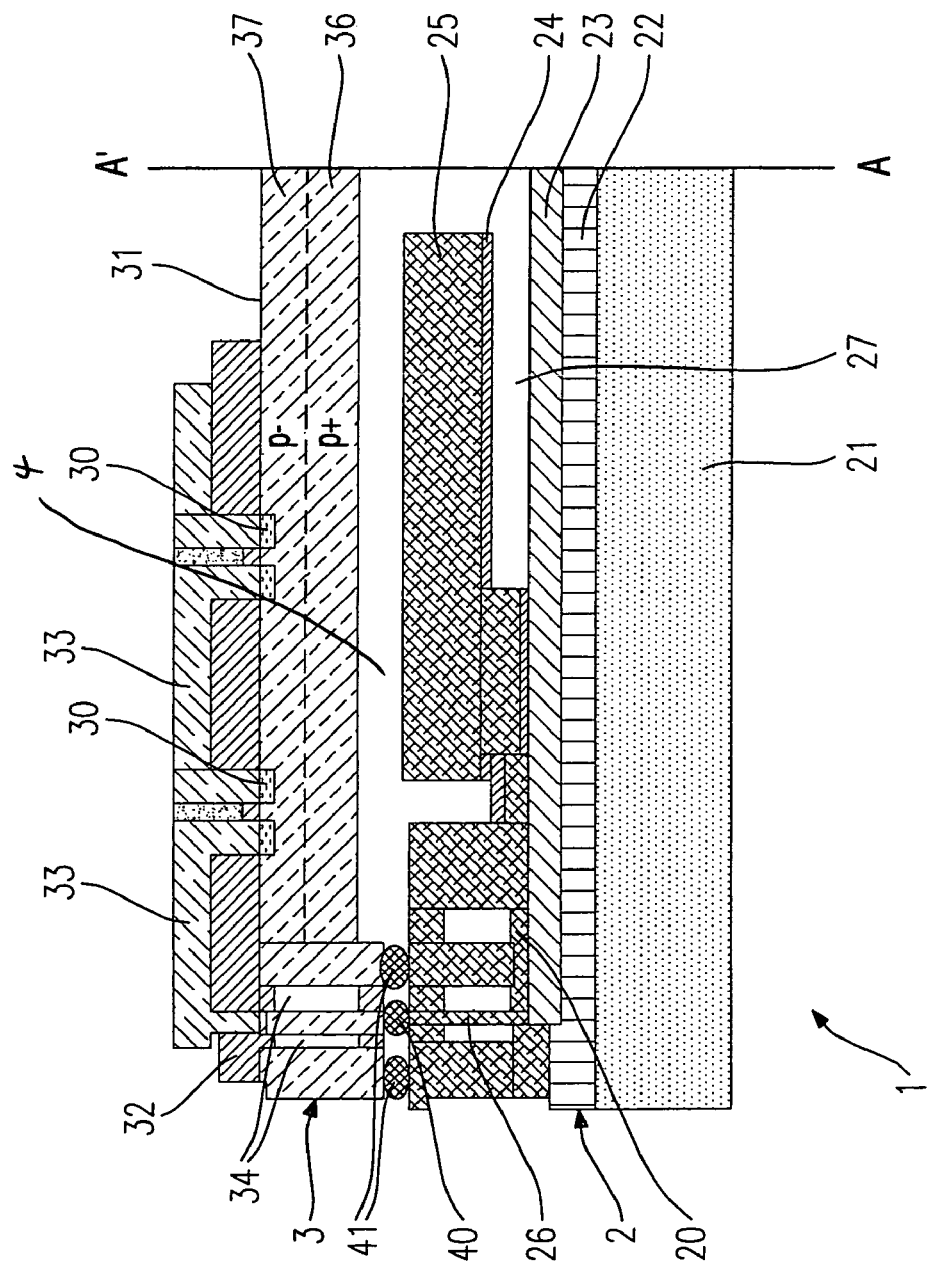
FIG. 1 is a cross-sectional view showing a portion of a sensor array according to a first exemplary embodiment of the present invention, the array being symmetrical with respect to plane A-A'.

FIG. 1 illustrates a cross-sectional view of a sensor array 1 according to a first exemplary embodiment of the present invention, but only the left half of sensor array 1 is shown, which sensor array is symmetrical with respect to plane A-A'.

According to the first exemplary embodiment, sensor array 1 includes a sensor section 2 and a separate cover section 3.

Sensor section 2 contains the actual micromechanical sensor structure which is manufactured in a conventional manner. An insulation layer 22, e.g., an oxide layer 22, is advantageously grown over the entire surface of a substrate 21, for example, a silicon substrate 21. In turn, an n-buried layer 23 is then deposited on the entire surface of oxide layer 22, which is subsequently structurable by etching, for example, for a predetermined conductivity. Another insulation layer 27 is provided over n-buried layer 23, which layer is represented by the section extending horizontally on the right side of FIG. 1, because the section has been partially etched away in a further manufacturing step. Certain semiconductor layers 24, 25, for example, doped polycrystalline silicon layers, are applied to this insulation layer 27.

The structure shown in FIG. 1 may be manufactured by suitable conventional manufacturing steps. In the first exemplary embodiment, a buried contact 26 is manufactured for an electric connection of electric circuit device 20 of sensor section 2 to cover section 3, as explained below in further detail.

The actual functional sensor layer is polysilicon layer 25, which is deposited in an epitaxy reactor, for example. Other semiconductor layers, for example, silicon-germanium layers, are also conceivable. This freely movable sensor structure is connected to bridge contact 26 by circuit device 20.

A second wafer is processed as a sensor wafer and/or cover section 3. A portion of electronic analyzer 30, for example, in the form of an operational amplifier for signal conditioning, is manufactured on surface 31 of cover section 3 by standard methods of semiconductor technology. The type of manufacturing operation may be executed in any desired manner and is not linked to any conditions pertaining to the sensor process. However, prior to manufacturing the last metallization layer 33, a through connection 32 is established, e.g., by a trench structure, i.e., a deep trench. Trenches 34 function as insulating trenches.

The wafer thickness is reduced to shorten processing times for manufacturing through connection 32. Layer thicknesses of approximately 180 µm are technologically feasible with wafer diameters of approximately 6".

The through connection may be established in several ways. For example, a wafer 36 made of a highly doped silicon material is used, and then to implement electronic analyzer device 30, an epitaxial layer 37 having a suitably low doping is applied. For the lowest possible interference, through connections 32 should be kept as small as possible, since the specific resistance thus also reaches a lower value. For such a low specific resistance, a highly doped, highly conductive semiconductor material 36 is to be used, but certain electronic analyzer devices 30, such as transistors or the like, tend to require a low-doped carrier having a higher resistance.

Thus, due to the structure described above, which includes highly doped wafer layer 36 and epitaxial layer 37 which has less doping, through connections 32 may be created directly by free-standing columns, i.e., bridges 32, which are separated from the environment by trench insulation, i.e., trenches 34. Trenches 34 must be relatively large in order to reduce parasitic capacitance. However, their size is limited to approximately 4 µm to 5 µm to permit a seal, e.g., by deposition of an oxide, in a technically feasible manner.

Because of the smaller dimension and the geometries described above, the expected parasitic capacitance is smaller by a factor of at least 20 to 30 in comparison with conventional wire bond connections.

A recess may be etched beneath the area of the movable structures to increase the distance between cover section 3 and sensor section 2.

Contact structures 40, e.g., aluminum structures 40 having a typical thickness of approximately 2 µm, are applied to one of two sections 2, 3 at a suitable location for the connection of sensor section 2 and cover section 3. These contact structures 40 are implemented in the form of points in the area of contacting.

To achieve a hermetic seal of sensor interior 4, a gasket 41, e.g., a closed aluminum ring 41, is additionally provided outside of contact structure 40.

The two sections 2, 3 are joined so they are adjusted to one another and are tempered at temperatures of more than 500° C. under a low pressure. In this way, the aluminum of contact structures 40 diffuses into the contact layers and thus forms a fixed connection between the two sections 2, 3.

As an alternative, other low-melting metals, e.g., gold, zinc, etc., may also be used.

In conclusion, through-connection columns 32 on cover section 3 are connected to electronic analyzer device 30 through last metallization layer 33 of the electronic operation.

Thus, the corresponding electric circuit of sensor section 2 is electrically connected to electronic analyzer 30 of cover section 3 via buried connection 26 of sensor section 2, contact structure 40 and through connection 32 of cover section 3.

Figure 2:
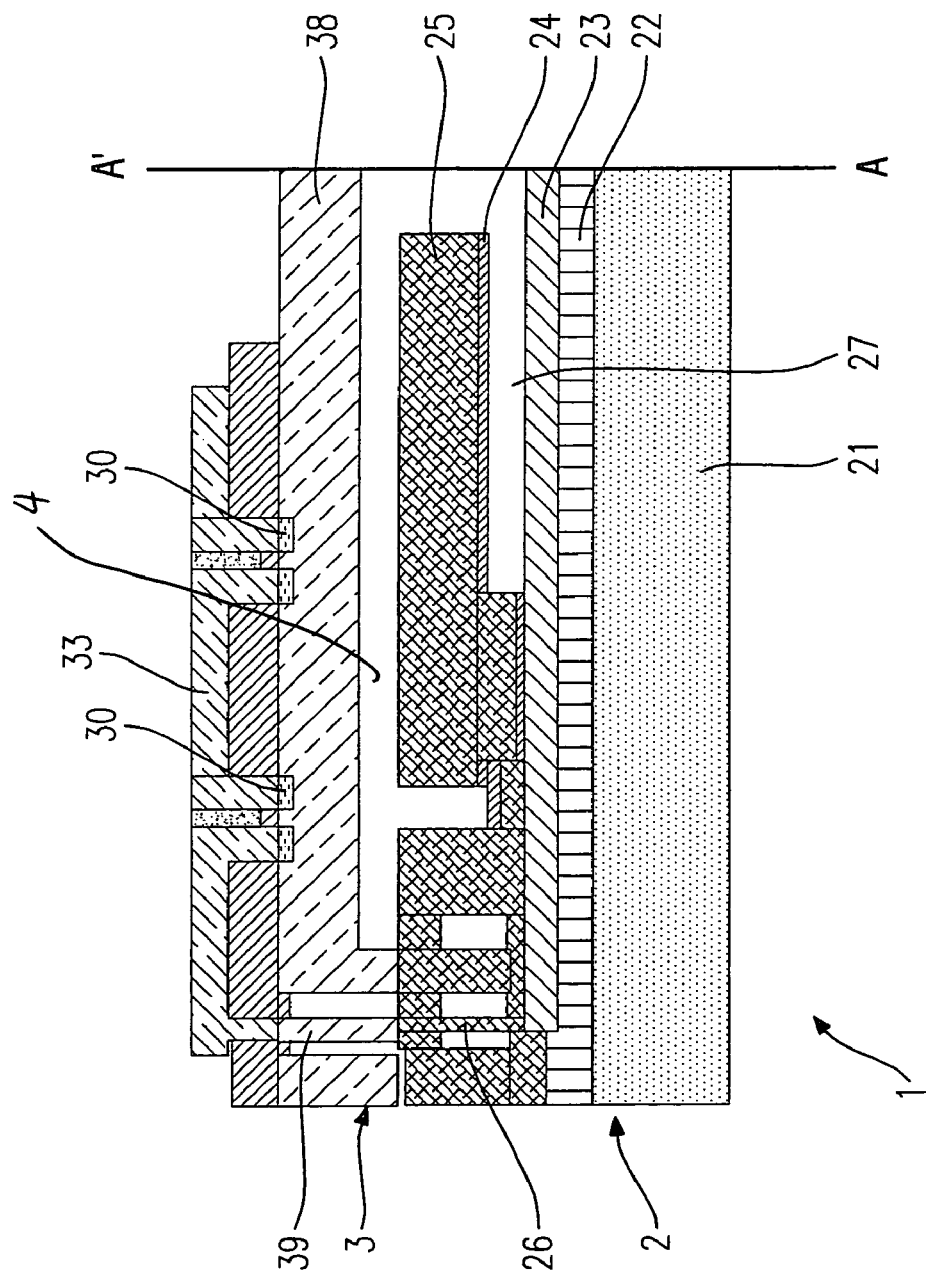
FIG. 2 is a cross-sectional view showing a portion of a sensor array according to a second exemplary embodiment of the present invention, the array being symmetrical with respect to plane A-A'.

FIG. 2 shows a cross-sectional view of a sensor array 1 according to a second exemplary embodiment of the present invention, but only the left half of sensor array 1 is shown, which sensor array is symmetrical with respect to plane A-A'.

Components and functions that correspond to those of the first exemplary embodiment are not explained in detail here, since they have been explained in detail above.

In contrast to the first exemplary embodiment, sensor array 1 according to the second exemplary embodiment does not have two discrete, separate sections 2, 3, but instead cover section 3 is applied to sensor section 2 in a uniform manufacturing sequence of entire sensor array 1 to yield a one-piece sensor array 1 having a more extensive layer structure without using additional connecting means.

The area corresponding to sensor section 2 of the first exemplary embodiment is manufactured in the same way and therefore needs no further explanation here.

In contrast to the first exemplary embodiment, an insulation layer is applied to sensor section 2 by etching away the upper clearance extending horizontally in FIG. 2. The insulation layer here is above the structured, but not yet exposed, sensor structure of sensor section 2, and is advantageously made of the same material as other insulation layer 22.

The insulation layer is structured so that through connections 39 are producible in a conventional way at suitable locations.

A semiconductor layer 38, e.g., a polysilicon layer or a polysilicon-germanium layer 38, which functions as a cover section layer 3, is subsequently applied to the insulation layer. Polysilicon layer 38 is provided with passages (not shown) at certain locations through which an etching medium may be introduced to remove the insulation layer and the reactants.

In conclusion, sensor interior 4 is hermetically sealed between sensor section 2 and polysilicon layer 38 by deposition of a thin layer under low pressure. This yields optimized prerequisites for the functioning of the micromechanical sensor.

By analogy with the first exemplary embodiment, at least part of an electronic analyzer device 30 is integrated into surface 31 of cover section 3. However, these are components which are made of a polycrystalline material characterized by suitably modified charge transport, dopant transport and MOS properties. The properties of these components are comparable to, or even better than, those of a TFT electronic unit and are thus sufficient for production of elementary analog functions.

The connection of these circuit elements to sensor section 2 beneath them also takes place similarly to the first exemplary embodiment. However the thicknesses of polysilicon layers 25, 38 are comparatively small so that the resistance of the printed conductors is further reducible. In addition, a direct connection during the deposition is ensured, and contact is made possible through contact windows produced lithographically, which contributes to a further reduction in interference variables and component size.

Although the present invention is described above on the basis of exemplary embodiments, it is not limited to these embodiments, but instead may be modified in a variety of ways.

The semiconductor materials mentioned here are cited only as examples and this is by no means to be understood as a comprehensive list; it is important only that the materials selected have the properties mentioned above and are compatible with one another for execution of the individual process steps.

What is claimed is:

1. A sensor array, comprising:
   a sensor section for supplying sensor signals, the sensor section having silicon substrate, a micromechanical sensor structure and a circuit device arranged on the silicon substrate, wherein the micromechanical sensor structure is made of polysilicon;
   a cover section provided on the sensor section to form a hermetically sealed sensor interior defined between the cover section and the sensor section, wherein the cover section is made of silicon; and
   an electronic analyzer device, wherein at least a portion of the electronic analyzer device is integrated into the cover section for analysis of the sensor signals, and wherein the electronic analyzer device is electrically connected to the circuit device of the sensor section;
   wherein the electronic analyzer device is provided on a surface of the cover section that faces away from the sensor interior.

2. The sensor array as recited in claim 1, wherein a pressure less than the atmospheric pressure is achieved in the sensor interior.

3. The sensor array as recited in claim 1, wherein the cover section is provided as a thin-layer section on the sensor section.

4. The sensor array as recited in claim 1, wherein the portion of the electronic analyzer device integrated into the cover section has signal conditioning which permits coupling of the sensor array to external circuit devices.

5. The sensor array as recited in claim 1, wherein the electronic analyzer device and the cover section are electrically connected to the circuit device of the sensor section by at least one through connection.

6. The sensor array as recited in claim 5, wherein the at least one through connection is a trench structure.

7. The sensor array as recited in claim 5, wherein the cover section is connected to the sensor section by contact structures.

8. The sensor array as recited in claim 7, wherein the contact structures are point aluminum structures.

9. The sensor array as recited in claim 1, wherein the cover section is made of one of polysilicon and polysilicon-germanium.

* * * * *